United States Patent [19]

Garner et al.

[11] Patent Number: 4,905,305
[45] Date of Patent: Feb. 27, 1990

[54] METHOD AND APPARATUS FOR CONTROLLING THE FREQUENCY OF OPERATION AND AT LEAST ONE FURTHER VARIABLE OPERATING PARAMETER OF A RADIO COMMUNICATIONS DEVICE

[75] Inventors: Terry N. Garner, Lynchburg; Ralph R. Sherman, Forest, both of Va.

[73] Assignee: General Electric Company, Lynchburg, Va.

[21] Appl. No.: 373,505

[22] Filed: Jun. 30, 1989

Related U.S. Application Data

[62] Division of Ser. No. 844,158, Mar. 26, 1986, Pat. No. 4,870,699.

[51] Int. Cl.$^4$ .............................................. H04B 1/26
[52] U.S. Cl. ..................................... 455/183; 455/186; 455/315; 455/317
[58] Field of Search ...................... 455/114, 62, 63, 67, 455/207–209, 183–186, 164–166, 295, 296, 314–317; 331/2, 18, 22; 375/99, 111

[56] References Cited

U.S. PATENT DOCUMENTS

| | | |
|---|---|---|
| 4,189,689 | 2/1980 | Triplett . |
| 4,254,504 | 1/1981 | Lewis et al. . |
| 4,282,497 | 8/1981 | Hulbert . |
| 4,373,206 | 2/1983 | Suzuki et al. . |
| 4,404,685 | 9/1983 | Rogers . |
| 4,484,355 | 11/1984 | Henke et al. . |
| 4,543,661 | 9/1985 | Defeuilly et al. . |
| 4,545,072 | 10/1985 | Skutta et al. ........................ 455/315 |
| 4,551,856 | 11/1985 | Victor et al. ........................ 455/316 |
| 4,661,995 | 4/1987 | Kashiwagi ........................... 455/317 |

FOREIGN PATENT DOCUMENTS

| | | |
|---|---|---|
| A10033390 | 8/1981 | European Pat. Off. . |
| A10038580 | 10/1981 | European Pat. Off. . |
| A20046835 | 3/1982 | European Pat. Off. . |
| A10075376 | 3/1983 | European Pat. Off. . |
| A2003685 | 3/1979 | United Kingdom . |
| A2015837 | 9/1979 | United Kingdom . |
| A2064905 | 6/1981 | United Kingdom . |

Primary Examiner—Benedict V. Safourek
Assistant Examiner—Curtis Kuntz
Attorney, Agent, or Firm—Nixon & Vanderhye

[57] ABSTRACT

The operating frequency of a radio transceiver and at least one further variable operating parameter of the radio transceiver are controlled in accordance with pre-stored information. Transmit operating radio frequency information is stored in a memory together with associated optimum modulation deviation level information (e.g., so as to maintain a predetermined modulation level at each operating frequency). Receive operating radio frequency information is similarly stored in the memory along with information indicating whether microprocessor clock oscillator frequency is to be shifted (e.g., so as to avoid spurious interfering harmonics emanating from the clock). When operating in the transmit mode, pre-stored modulation gain level information associated with the selected transmit frequency controls the gain of the modulator circuits to compensate for expected changes in modulator circuit gain with change in transmit radio frequency. In the receive mode, the microprocessor clock oscillator frequency may be shifted in accordance with the selected receive frequency, thereby automatically shifting harmonics of the microprocessor clock oscillator out of the receiver bandpass when necessary to avoid locally-generated signals from interfering with signal reception.

15 Claims, 5 Drawing Sheets

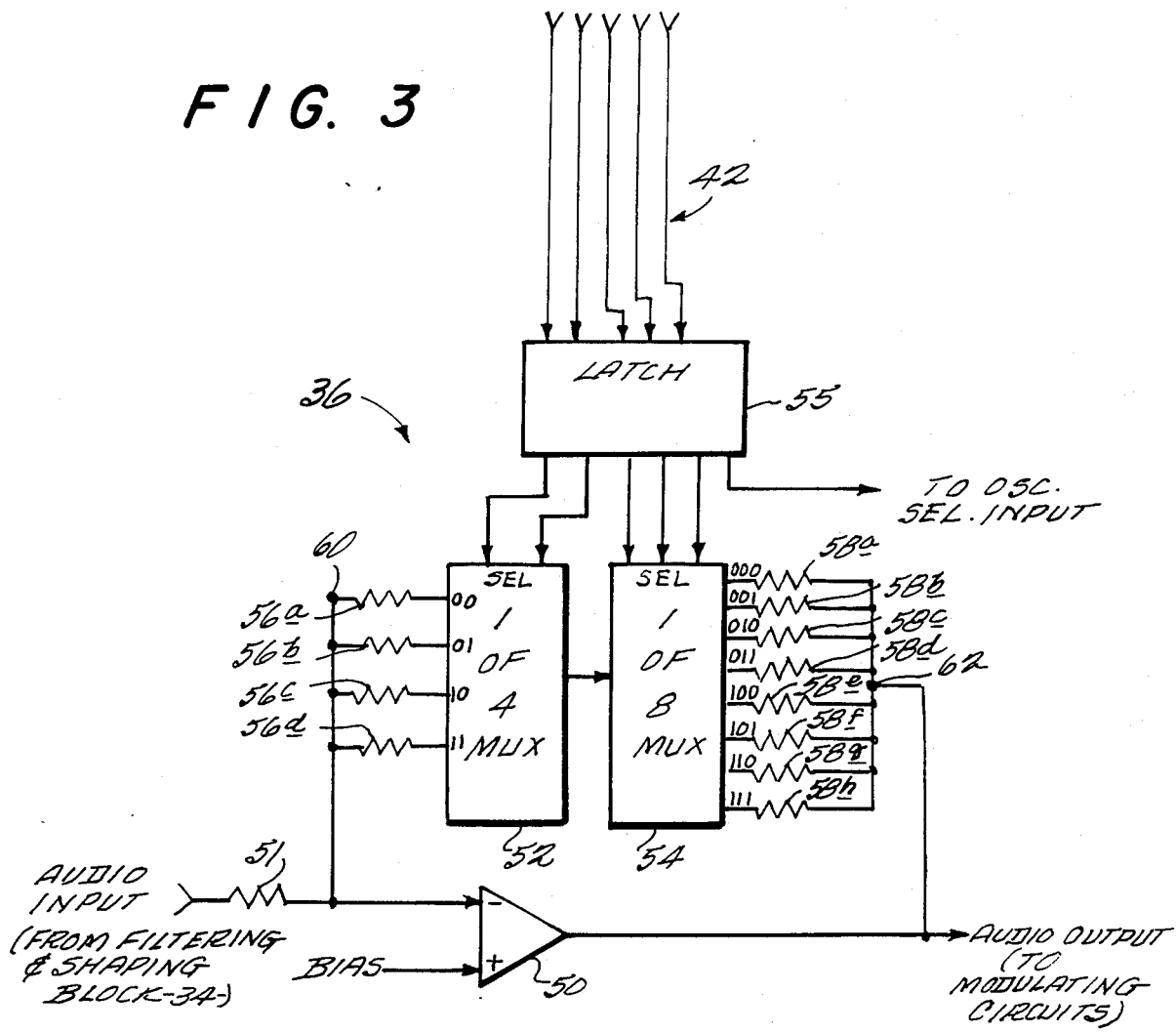
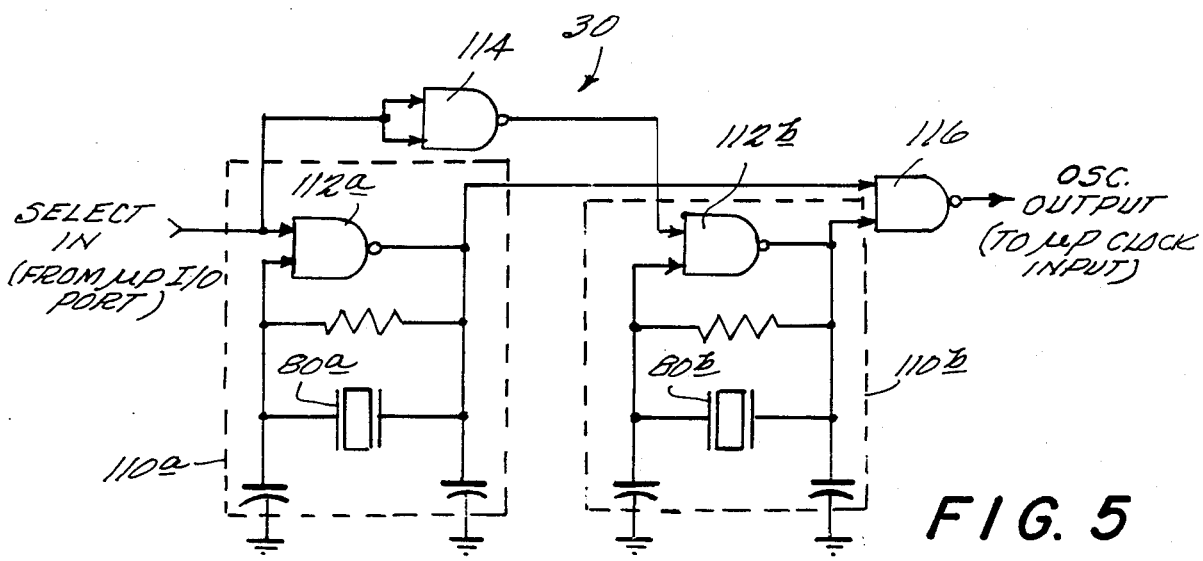

METHOD AND APPARATUS FOR CONTROLLING THE FREQUENCY OF OPERATION AND AT LEAST ONE FURTHER VARIABLE OPERATING PARAMETER OF A RADIO COMMUNICATIONS DEVICE

This is a division of application Ser. No. 06/844,158, filed March 26, 1986 now U.S. Pat. No. 4,870,699.

FIELD OF THE INVENTION

The present invention is related to digitally controlled radio communication devices and, more particularly, to microprocessor-controlled, frequency-synthesized radio frequency transmitters and receivers (sometimes hereinafter referred to as "digital" radios).

BACKGROUND OF THE INVENTION

It is generally desirable in modern radiotelephone communications to maintain a relatively high average carrier modulation level while not exceeding a predetermined maximum modulation level. When a modulated carrier signal is detected in a radio receiver, the output of the receiver detector follows the deviation of the received modulated carrier. It is desirable to modulate the carrier at as high a level as possible (consistent with bandwidth limitations imposed by law and by transmitter and receiver design) to increase the useful receiver output level, and thus increase communications range and decrease degradation of received signal quality due to noise fading and other factors.

Transmitted carrier modulation level is determined by the amplitude of the intelligence (e.g., voice) signal applied to the modulating circuits (typically, the oscillator or frequency synthesizer in frequency modulation transmitters). Signal processing such as amplitude compression, amplitude limiting and the like can be used to increase the average carrier modulation level. Ideally, average carrier modulation level during useful signal transmission should remain relatively constant at or near the maximum permitted modulation level despite changes in parameters that may affect transmitter modulation level (e.g., carrier frequency, modulating signal characteristics, rf power output, etc.).

Variation in modulation level with change in carrier frequency has not been a major problem in past frequency modulation transceivers because transceivers have generally been incapable of operating outside a relatively narrow operating bandwidth. Hence, most existing FM digital frequency-synthesized transmitters do not provide compensation of carrier modulation level for changes in transmitter operating frequency.

A typical prior-art synthesized transceiver is capable of operating anywhere within a 20 MHz range, and has a maximum carrier deviation level which varies between about 3 and 5 kHz as carrier frequency is changed. In such prior-art transceivers, modulation level (i.e., the effective gain of the modulating circuits) is set to a fixed level such that a predetermined maximum modulation deviation level (e.g., 5 kHz for narrow-band FM) is never exceeded. U.S. laws governing radio communications do not require a minimum deviation level, but do set a maximum permissible modulation level (and associated envelope bandwidth)—so that adjustment of maximum modulation level is sufficient to guarantee that the transceiver always operates within the modulation level limits set by law no matter what the carrier frequency is set to.

This solution unfortunately has the severe disadvantage that the transceiver carrier modulation level is at or near the maximum permissible level only for a few of the many frequencies at which the transceiver is capable of operating, and is far less than this maximum level at many (if not most) transceiver operating frequencies. Communications range and signal quality and intelligibility are degraded on many transmitter operating frequencies as a result.

FIG. 1 is a graphical illustration of carrier modulation deviation level of an exemplary frequency-modulated radio transmitter plotted against transmit frequency for various methods of modulation deviation level compensation. As the curves marked "A" in FIG. 1 shows variations in modulation deviation level of an uncompensated transmitter can be as much as 3 dB with a change in operating frequency of 20 MHz. To add to this problem, variations in modulation deviation level between different production units may vary by as much as 1 dB or more (as is depicted by three different curves A-1. A-2 and A-3). Thus, the modulation deviation of a completely uncompensated transmitter might fall anywhere within the limits between curves A-1 and A-3. By adjusting the deviation at center band (460 MHz in the example shown) with a variable circuit component such as a potentiometer, the total variation is limited to that indicated by curve A-2 (still 3 dB for a change in operating frequency of ±10 MHz).

Some countries of the world regulate minimum as well as maximum FM deviation levels, so that some correction of modulation level with change in transmitter operating frequency is necessary if legal requirements are to be complied with. For example, some transceivers provide a non-linear circuit within the transmitter modulator which adjusts the audio modulation level as a function of synthesizer tuning voltage. This non-linear circuit provides some degree of modulation level correction, but the deviation level is not programmable for individual operating frequencies.

The curve of FIG. 1 marked "B" shows the variation in modulation deviation level for a transmitter having additional non-linear circuit components as described above. Such additional compensation circuit components can reduce variation in modulation level to less than plus or minus 0.5 dB. Unfortunately unit-to-unit variations in modulation deviation level requires overall modulator circuit gain to be adjusted (e.g.. by adjusting a variable resistor controlling the gain of one of the modulator stages) so that the average modulation level is as high as possible consistent with legal requirements. Such adjustments are difficult and time-consuming to make, and must be individually performed for each unit.

A technique which provides constant transmitter modulation deviation level over a wide range of transmit frequencies and which also compensates for variations between transmitter units would increase effective transmission range and ensure compliance with pertinent legal requirements, and would therefore be highly useful.

Another problem which often plagues modern digital mobile radio transceivers is the generation, by the internal circuitry of the transceiver itself, of signals which interfere with reception of desired signals. Sophisticated modern communications devices generally employ high-speed synchronous digital circuitry (e.g.. microprocessors) driven by clock synchronizing signals. To obtain the speed performance such digital circuitry is capable of providing, it is necessary to generate one or more clock synchronizing signals of relatively high frequency (e.g.. 4 MHz). Harmonics of the clock frequency sometimes fall within the receiver operating frequency band, causing spurious responses which may interfere with the operation of the radio transceiver.

For instance, suppose a radio transceiver capable of operating in the 400 MHz range with a receiver bandwidth of 12 kHz is controlled by an internal microprocessor driven by a crystal oscillator operating at 4 MHz. If the receiver of this transceiver is tuned to an operating frequency of 464.000 MHz, a clear-channel spectrum of 463.994 MHz to 464.006 MHz must be maintained to avoid interference with signals to be received. Unfortunately, an on-channel spurious response may be caused by the 116th harmonic of the microprocessor oscillator (4.0 MHz×116=464.000 MHz).

One solution to the problem described above is to significantly improve the shielding between the radio frequency circuitry and the digital circuitry of the transceiver so that no signals generated by the digital circuitry can find their way into the RF circuitry. Because of the high sensitivity and the compactness of modern radio transceivers, it is extremely difficult to provide sufficient shielding to guarantee complete freedom from receiver interference.

Another method sometimes used to reduce interference of received signals caused by spurious signals generated by a microprocessor clock oscillator is to select an oscillator frequency which is not harmonically related to any frequencies desired to be received. Although this solution works well for transceivers having only a few fixed operating frequencies, modern microprocessor-controlled radio transceivers are capable of operating on a large number of channels and can be programmed (or reprogrammed) in the field to operate on new or different channels than those selected at time of production. It is sometimes impossible to locate a clock oscillator frequency which is not harmonically related to any of a large number of possible operating frequencies. Moreover, the clock oscillator frequency may have to be changed every time the transceiver is programmed to operate on new or different operating frequencies, thereby increasing field servicing time, cost and complexity. An arrangement which guarantees complete freedom from internal oscillator-generated receiver interference regardless of receive frequency would be very valuable and useful.

SUMMARY OF THE INVENTION

The present invention provides a method and apparatus for controlling the frequency of operation and at least one further variable operating parameter of a radio transceiver.

A plurality of preset transmitter and/or receiver operating frequencies are stored along with corresponding information representing the value of at least one further variable operating parameter of the radio transmitter and/or receiver. One of the stored plurality of operating frequencies is selected, and the operating frequencies of the transmitter and/or receiver are set to the stored selected operating frequency. The further variable operating parameter of the radio transceiver is controlled in accordance with the stored further variable operating parameter value corresponding to the selected stored operating frequency.

For example, a plurality of preset transmitter operating frequencies may be stored, and, for each of the stored operating frequencies, a corresponding preset modulation gain level may also be stored. One of the stored plurality of transmitter operating frequencies is selected and a radio frequency signal at the selected transmitter operating frequency is produced. An input signal is amplified by an amplifier having a gain set to the stored preset gain level corresponding to the optimum gain value for the particular selected transmitter operating frequency, and the radio frequency signal is modulated with the resulting amplified input signal.

A variable-gain amplifier may be used to amplify the input signal. The gain of the variable-gain amplifier may be set to the preset modulator gain level corresponding to the selected transmitter operating frequency. In one exemplary arrangement the gain-adjusted version of the input signal is produced by an operational amplifier output. The value of a resistance connected between the operational amplifier input and output terminals is adjusted to attain the stored preset gain level associated in memory with the selected transmitter operating frequency.

The present invention may thus automatically compensate modulation deviation level for changes in transmitter operating frequency by permitting a unique deviation level to be programmed for each operating frequency (or range of frequencies). That is the output amplitude produced by the transmitter modulator is controlled by values stored in a memory associated with data specifying transmitter operating frequency also stored in memory. When a transmitter operating frequency is selected, an associated modulation level is thus also available for automatic selection.

A different modulation level may thus be programmed for each operating channel (or subgroup of channels). so that any operating frequency-dependent non-linearities in the transmitter modulator can be compensated for by storing appropriate gain level information in the memory circuit. Restated still differently, since the modulation level of a frequency-modulated radio transmitter can be digitally programmed—and since a desired specific modulation level is specified for each radio frequency channel (or subgroup). modulation amplitude can be programmed to overcome modulator non-linearity and ensure a substantially constant modulation level over a wide range of transmitter operating frequencies.

As another example radio receiver of the type including a microprocessor may be controlled to prevent spurious signals such as harmonics generated along with a clock signal synchronizing the operation of the microprocessor from interfering with radio frequency signals desired to be received.

Informtion representing a plurality of preset receiver operating frequencies may be stored, and, for each of the preset receiver operating frequencies, corresponding control information specifying one of at least a first and a second state may also be stored. One of the plurality of receiver operating frequencies is selected, and a radio frequency receiver is tuned to receive the selected frequency in response to the stored receive frequency information.

A microprocessor included in the receiver device may be synchronized to operate at a first frequency if the stored control information corresponding to the selected receive frequency specifies the first state, and may be synchronized to operate at a second frequency different from the first frequency if the stored control information corresponding to the selected receive frequency specifies the second state.

The synchronizing signal may be continuously produced at a nominal frequency, and may be shifted to a different frequency offset from the nominal frequency whenever the stored control information corresponding to the selected receive frequency specifies the second state. The microprocessor clock frequency is thus either the nominal frequency or the shifted frequency, a selection between the two being made as a function of receiver operating frequency.

A synchronizing signal of a nominal frequency may be produced by a crystal oscillator circuit as determined by the characteristics of a crystal frequency-determining element. A reactance may be switched into the crystal oscillator circuit when the stored control information corresponding to the selected receive frequency specifies the second state.

Thus, the clock oscillator used to synchronize the frequency of operation of the microprocessor produces a frequency which is selectively switched between two alternate frequencies as needed to shift harmonics or other spurious signals produced by the clock oscillator out of the passband of the receiver. Such frequency shifting is performed automatically as a function of receiver operating frequency in accordance with pre-programmed information stored in a memory along with the information which determines receiver operating frequency.

BRIEF DESCRIPTION OF THE DRAWINGS

These and other features of the present invention will be better and more completely understood by studying the following detailed description of presently preferred embodiments together with the appended drawings, of which:

FIG. 3 is a schematic diagram of an exemplary circuit for use as the programmable attenuator shown in FIG. 2;

FIG. 5 is a schematic diagram of a further circuit suitable for use as the crystal oscillator shown in FIG. 2.

DETAILED DESCRIPTION OF PREFERRED EMBODIMENTS

Figure 2:
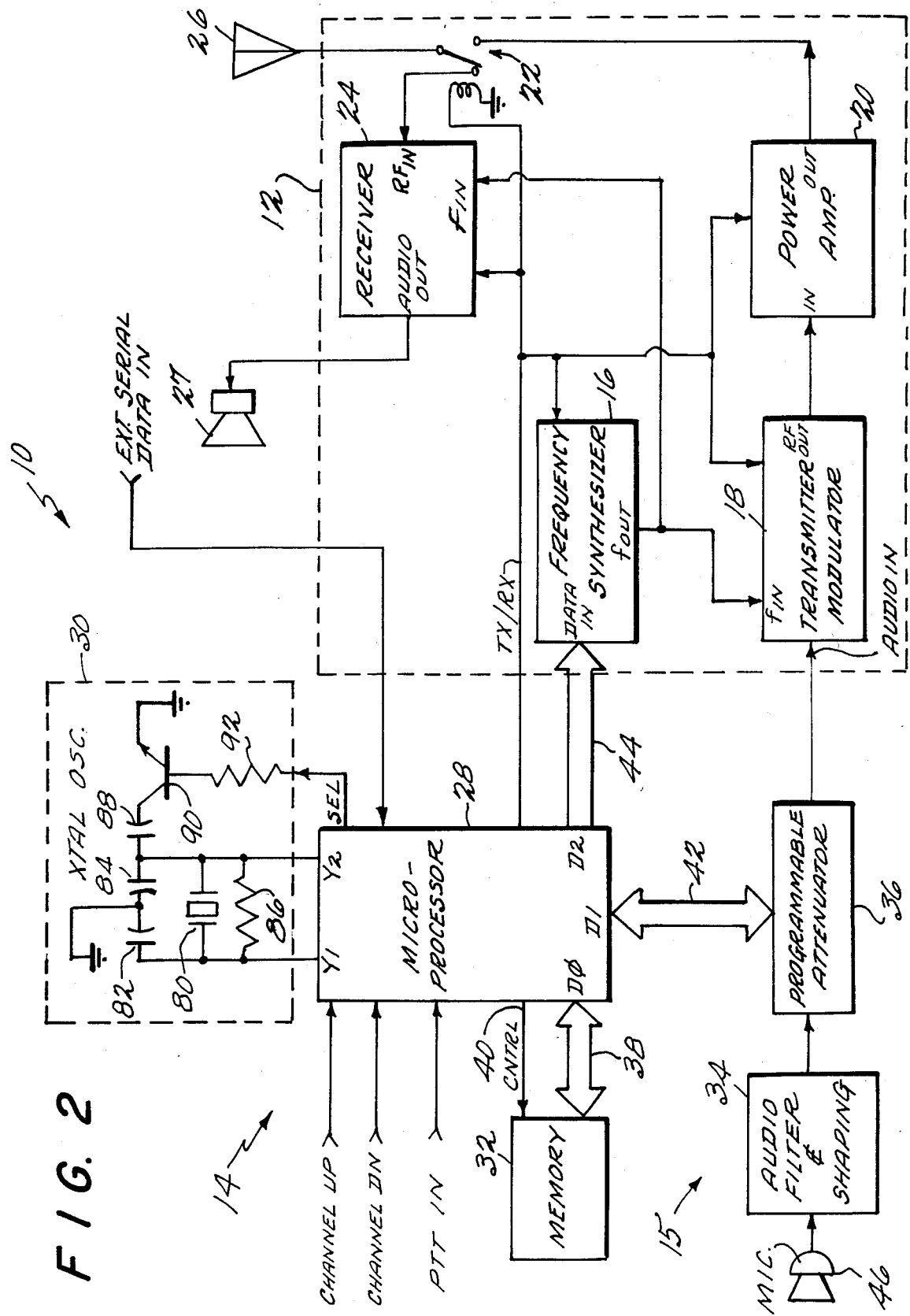
FIG. 2 is a block diagram of a presently preferred exemplary embodiment of a microprocessor-controlled radio frequency transceiver in accordance with the present invention.

FIG. 2 is a schematic block diagram of a presently preferred exemplary embodiment of a frequency-modulated radio frequency transceiver 10 in accordance with the present invention. Transceiver 10 includes a radio frequency (RF) section 12, a digital control section 14, and an audio input section 15.

RF section 12 includes a frequency synthesizer 16, a transmitter modulator 18 a power amplifier 20, a transmit/receive (T/R) switch 22 and a receiver 24. RF section 12 operates in two alternate modes: a transmit mode and a receive mode. In the transmit mode. RF section 12 applies a modulated RF signal of a desired frequency to an antenna 26. In the receive mode RF section 12 converts a modulated RF signal of a desired frequency received by antenna 26 into a useful audio signal. Details concerning the structure and operation of RF section 12 will now be presented.

Frequency synthesizer 16 is a conventional frequency synthesizer circuit which produces a radio-frequency signal (at an output terminal $f_{OUT}$) the frequency of which is controlled by digital data applied to the DATA IN input of the circuit. Thus frequency synthesizer 16 may be considered a digital-to-analog converter which converts digital information inputted thereto into an analog radio frequency signal (as understood by those skilled in the art, frequency synthesizer 16 employs phase-locked loop or similar arrangements to provide sufficient output signal frequency stability at the frequencies at which transceiver 10 operates).

The output $f_{OUT}$ of frequency synthesizer 16 is applied to the input $f_{IN}$ of receiver 24. Receiver 24 in the preferred embodiment is a conventional superheterodyne frequency-modulation receiver. The input terminal $RF_{in}$ of receiver 24 is connected to antenna 26 via T/R switch 22, and has an AUDIO OUT output terminal which is connected to a loudspeaker 27 or other acoustic transducer.

The output $f_{OUT}$ of frequency synthesizer 16 controls the operating frequency of the receiver 24 (e.g., the input terminal $F_{IN}$ of the receiver may be connected to a conventional mixer circuit internal to the receiver which produces a sum or difference frequency resulting from heterodyning the frequency synthesizer output signal and a signal of a desired frequency received by antenna 26, the sum or difference frequency falling within the bandpass of a conventional intermediate frequency (IF) circuit of the receiver as is well known). Receiver 24 may be entirely conventional in design, and further details concerning its function and operation may be found in a variety of standard reference materials (e.g., *The Radio Amateur's Handbook* published by the American Radio Relay League (Newington, Conn. latest edition)).

The output $f_{OUT}$ of frequency synthesizer 16 is also connected to an input $f_{IN}$ of a conventional frequency-modulated transmitter modulator 18. Transmitter modulator 18 may be a phase-shift FM modulator of conventional design which frequency-modulates (or phase-shift modulates) the RF signal applied to its $f_{IN}$ input with an audio signal applied to its AUDIO IN input and produces a resulting frequency-modulated RF signal at its RF OUT output terminal (alternatively, the voltage controlled oscillator of frequency synthesizer 16 can be frequency modulated by an audio signal). As will be understood, the deviation (i.e., modulation index) of the modulated RF signal produced by modulator 18 is determined by the amplitude of the audio signal applied to the AUDIO IN terminal of the modulator.

The modulated RF signal produced by modulator 18 is applied to the input of a conventional power amplifier 20. The output of power amplifier 20 is connected to T/R switch 22 for application to antenna 26. Power amplifier 20 in the preferred embodiment may be a conventional class C radio frequency amplifier which amplifies the amplitude of the modulated RF signal produced by modulator 18 to a desired level and efficiently couples the amplified RF signal to antenna 26.

A transmit/receive (TX/RX) control signal applied to RF section 12 controls whether transceiver 10 is operating in the transmit or in the receive mode. This TX/RX signal is applied to control inputs of modulator 18, power amplifier 20, receiver 24 and T/R switch 22. Suppose, for example, that the TX/RX signal assumes a logic level 1 signal level (high) when the transceiver is in the transmit mode, and assumes a logic level 0 signal level (low) when the transceiver is in the receive mode. When the TX/RX signal is at logic level 0 modulator 18 and power amplifier 20 are both disabled T/R switch 22 is controlled to connect antenna 26 to the input $RF_{in}$ of receiver 24, and receiver 24 is enabled. In this receive mode, the output of frequency synthesizer 16 controls the frequency of signals received and demodulated by receiver 24.

When the level of the TX/RX signal rises to logic level 1 receiver 24 is disabled (and its AUDIO OUT terminal is muted) transmitter modulator 18 and power amplifier 20 are enabled, and T/R switch 22 is controlled to connect antenna 26 to the output of the power amplifier. In the transmit mode of operation, frequency synthesizer 16 produces an rf output signal of a desired transmit frequency (or a subharmonic thereof if power amplifier 20 includes conventional frequency multiplying circuits) to be modulated by modulator 18, amplified by power amplifier 20, and applied via T/R switch 22 to antenna 26.

Digital control section 14 of transceiver 10 produces signals which control RF section 12 (e.g., the TX/RX signal and the digital data which determines the output frequency of the rf signal produced by frequency synthesizer 16). In the preferred embodiment, control section 14 includes a microprocessor 28 (or other suitable digital signal processor), a clock oscillator circuit 30 and a memory 32 (preferably a Random Access Memory with a battery back-up to make it non-volatile or an EPROM).

Microprocessor 28 in the preferred embodiment includes three (3) data input/output ports: D0, D1 and D2 (although three separate I/O ports are shown it will be understood by those skilled in the art that fewer I/O ports and I/O multiplexing could be used instead). The D0 I/O port of microprocessor 28 is connected to the data input/output port of memory 32 via a plurality of bidirectional signal lines 38 (an additional control signal 40 produced by microprocessor 28 controls the operating, e.g., read/write, mode of memory 32). The D1 I/O port of microprocessor 28 in the preferred embodiment is connected to provide digital information to programmable attenuator 36 via data lines 42. The D2 I/O port of microprocessor 28 is connected, via data lines 44, to the DATA IN input terminal of frequency synthesizer 16.

Microprocessor 28 is connected to receive additional control and/or data inputs from external devices via additional signal lines (these additional signal lines may be connected to spare inputs of I/O ports D0–D2, or may be connected to an additional I/O port (not shown) of microprocessor 28 if one is available). A PTT IN signal input to microprocessor 28 is connected to an external transmit/receive controller in the preferred embodiment (such as a push-to-talk switch mounted on a microphone the output of a voice-operated relay (VOX), or the like). In the preferred embodiment, transceiver 10 operates in the transmit mode when the level of the PTT IN signal is at logic level 1, and otherwise operates in the receive mode.

A signal CHANNEL UP and a further signal CHANNEL DN are applied to inputs of microprocessor 28 by an external channel selector device (not shown)—this channel selector device could comprise, for example, discrete channel up and channel down control switches, a conventional channel selector switch and associated encoder logic or the like. Both the CHANNEL UP and CHANNEL DN signals are normally at logic level 0 in the preferred embodiment. When the CHANNEL UP signal rises to logic level 1, microprocessor 28 selects an operating channel which is "above" (in frequency, in a predetermined order, or both) the channel at which transceiver 10 was operating previously. Similarly, microprocessor 28 interprets a logic level 1 CHANNEL DN signal as a request to change the operating channel of transceiver 10 to a channel which is "below" (in frequency in a predetermined order, or both) the channel at which transceiver 10 was previously operating on.

In the preferred embodiment, channels comprise a transmit frequency and an associated receive frequency pair, so that the signals CHANNEL UP and CHANNEL DN are interpreted by transceiver 10 as requests to change both the transmit and the receive frequency. For example, a logic level 1 CHANNEL DN signal is interpreted as a request to "decrement" the transceiver operating channel "number" to a different preset pair of transmit and receive frequencies the user associates with the decremented channel "number." It will be understood that the transmit and receive frequencies could be independently selected if desired.

The EXT SERIAL DATA IN line connected to an I/O input of microprocessor 28 permits digital data generated externally to transceiver 10 to be applied to microprocessor 28. One use of the SERIAL DATA IN line is to change the contents of memory 32. In this use, a serial digital signal of a predetermined format specifying new contents of memory 32 is produced externally to transceiver 10 (e.g., by a mini-computer). This serial digital data is applied to microprocessor 28 via the SERIAL DATA IN line. Microprocessor 28 in the preferred embodiment includes an internal conventional UART (universal asynchronous receiver/transmitter) which receives the data applied to the SERIAL DATA IN line and converts this data to parallel format. Microprocessor 28 then stores the parallel-converted data in predetermined locations in memory 32. In this way, the control functions of microprocessor 28 can be programmed in the field.

A crystal oscillator 30 connected to microprocessor 28 provides a clock synchronizing signal for synchronizing microprocessor cycles. In the preferred embodiment, crystal oscillator 30 produces a clock signal at a frequency of approximately 4 MHz (to provide a microprocessor cycle time of 250 nanoseconds). A select output signal (SEL) generated by microprocessor 28 controls the frequency of crystal oscillator 30 in a manner which will be explained in further detail shortly.

The structure and operation of audio section 15 will now be described. Audio information to be transmitted is produced in the preferred embodiment by a conventional microphone 46 (although it will be understood that any source of analog and/or digital information may be used instead). The output of microphone 46 is applied to the input of an audio filtering and shaping circuit 34 (conventional in design) which processes the output of microphone 46 in a conventional manner (e.g., by filtering it to remove undesired frequency components, providing amplitude limiting and/or compression to increase average amplitude, reducing the amplitude of amplitude peaks, and providing preamplification all in a well-known manner). The output of audio filtering and shaping circuit 34 is connected to the input of programmable attenuator 36. The output of programmable attenuator 36 is connected to the AUDIO IN terminal of transmitter modulator 18.

Figure 1:
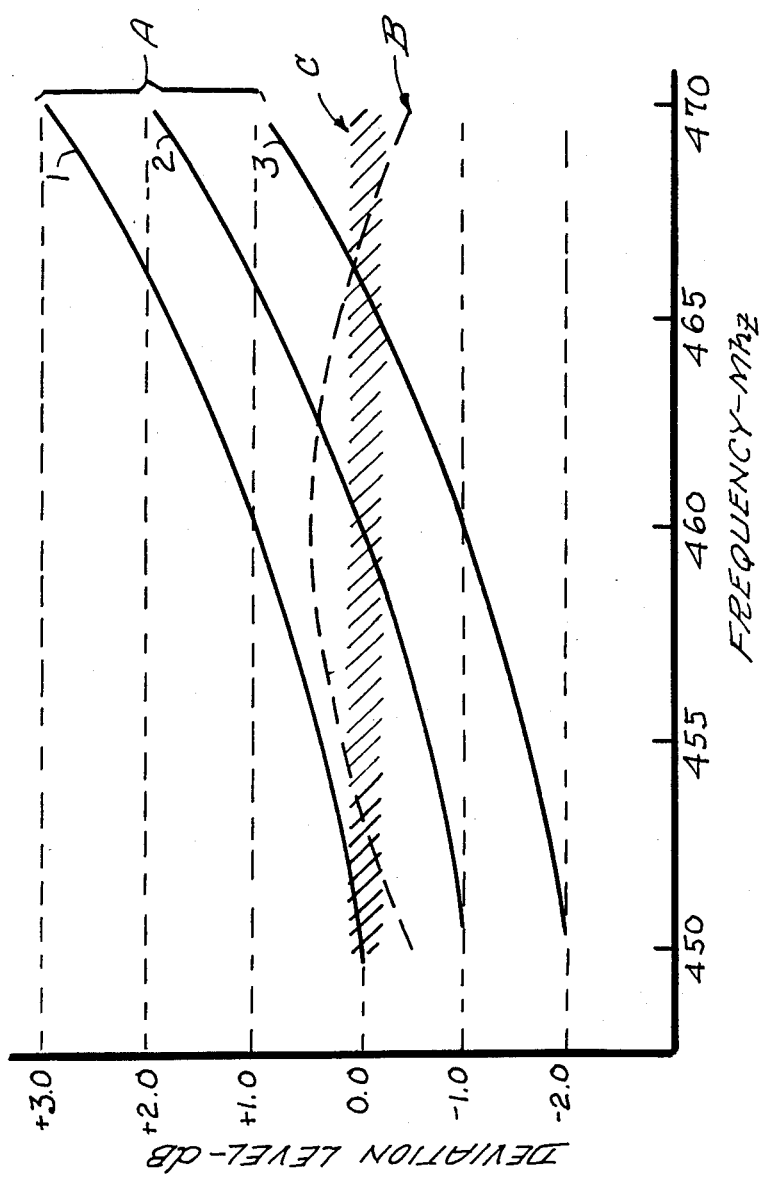
FIG. 1 is a graphical illustration of exemplary variations in modulation deviation level with change in operating frequency for a transmitter with no compensation, a transmitter with a non-linear compensation circuit, and a transmitter with programmable compensation in accordance with the present invention.

FIG. 3 is a schematic diagram of an exemplary circuit for use as programmable attenuator 36 shown in FIG. 1. Programmable attenuator 36 in the preferred embodiment includes an operational amplifier 50 a four-to-one analog multiplexer 52, a one-to-eight analog multiplexer 54, a latch 55, a first plurality of resistors 56a–56d and a second plurality of resistors 58a–58h.

The analog audio output of audio filtering and shaping circuit 34 (see FIG. 2) is connected to the inverting (−) input of operational amplifier 50 (through a series resistor 51 in the preferred embodiment). and is also connected to a node 60 (through the series resistor). Resistors 56a–56d (which together comprise a "ladder"-type resistor network) connect node 60 to different ones of analog inputs of multiplexer 52. The analog common terminal of multiplexer 52 is connected to the analog common terminal of multiplexer 54. The eight terminals of multiplexer 54 (the selected one of which depends upon the digital value applied to the multiplexer select inputs) are connected to a common node 62 through different ones of resistors 58a–58h (which together comprise a ladder-type resistor network). Node 62 is connected to the output terminal of operational amplifier 50.

The select inputs of multiplexer 52 and multiplexer 54 are connected to signals produced by I/O terminal D1 of microprocessor 28, and are applied to the multiplexers via signal lines 42 (as will be understood these microprocessor-produced signals may be latched and/or registered by latch 55 or a similar device if desired).

In the preferred embodiment a 5-bit digital value (word) controls the combination of resistors 56a–56d and resistors 58a–58h selected by multiplexers 52 and 54 The two high-order bits of the 5-bit word control which one of four terminals (00, 01, 10 or 11) is selected by multiplexer 52 while the lower 3-bits of the word control which of the eight terminals (000, 001, 010, 011, 100, 101, 110 or 111) of multiplexer 54 is selected. For example, the five-bit digital word 10110 causes MUX 52 to select its "10" terminal and controls MUX 54 to select its "110" terminal, thus providing an analog signal path between the inverting input and the output of operational amplifier 50 through series-connected resistors 56c and 58g.

The values of resistors 56a–56d and the values of resistors 58a–58h are chosen to provide desired signal weighting over a desired range. As mentioned, resistors 56a–56d and node 60 together comprise a conventional resistor ladder network, as do resistors 58a–58h together with node 62. In one suitable arrangement, the values of resistors 58a–58h may be set as follows:

| | | |
|---|---|---|
| $R_{58a} = X,$ | | (1a) |
| $R_{58b} = X + \Delta X$ | | (1b) |
| $R_{58c} = X + 2\Delta X,$ | | (1c) |
| . | | |
| $R_{58h} = X + 7\Delta X$ | | (1d) |

| | | |
|---|---|---|
| $R_{56a} = Y,$ | | (2a) |
| $R_{56b} = Y + 8\Delta X,$ | | (2b) |
| $R_{56c} = Y + 16\Delta X,$ and | | (2c) |
| $R_{56d} = Y + 24\Delta X.$ | | (2h) |

(in the preferred embodiment, programmable attenuator 36 attenuates in linear steps, so that each step increases by a constant resistance $\Delta X$). The values of resistors 56a–56d may be set in a similar fashion, as follows:

$$R_{56a} = Y, \tag{2a}$$

$$R_{56b} = Y + 8\Delta X, \tag{2b}$$

$$R_{56c} = Y + 16\Delta X, \text{ and} \tag{2c}$$

$$R_{56d} = Y + 24\Delta X. \tag{2h}$$

The values X and Y are chosen in accordance with the open-loop gain of operational amplifier 50 and with the values of other components associated with operational amplifier 50 (e.g., the value of resistor 51) to produce desired range of gain of programmable attenuator 36.

As should now be evident, programmable attenuator 36 functions as a closed-loop operational amplifier with a feedback resistance (i.e., the resistance between output and input terminals) which is programmable in response to a 5-bit digital word applied to multiplexers 52 and 54 via signal lines 42. The gain of programmable attenuator 36 may be expressed as follows:

$$\text{GAIN} = R_{prog}/R_{51} \tag{3}$$

where $R_{prog}$ is equal to the value of the one of resistors 56a–56d selected by multiplexer 52 plus the value of the one of resistors 58a–58h selected by multiplexer 54 (ignoring effects of the BIAS signal applied to the non-inverting input of operational amplifier 50). The gain of programmable attenuator 36 can be changed to any one of 32 different, discrete, predetermined gain levels by applying the appropriate 5-bit digital value to the select inputs of multiplexers 52. 54 via signal lines 42.

It will be understood that the circuit shown in FIG. 3 is only one of many different types of digitally-programmed variable gain circuits which are suitable for use in the preferred embodiment. Any means for adjusting the gain of a linear amplifying circuit in accordance with the value of a digital signal could be used instead of the programmable attenuator arrangement shown in FIG. 3 with good results.

Figure 4:
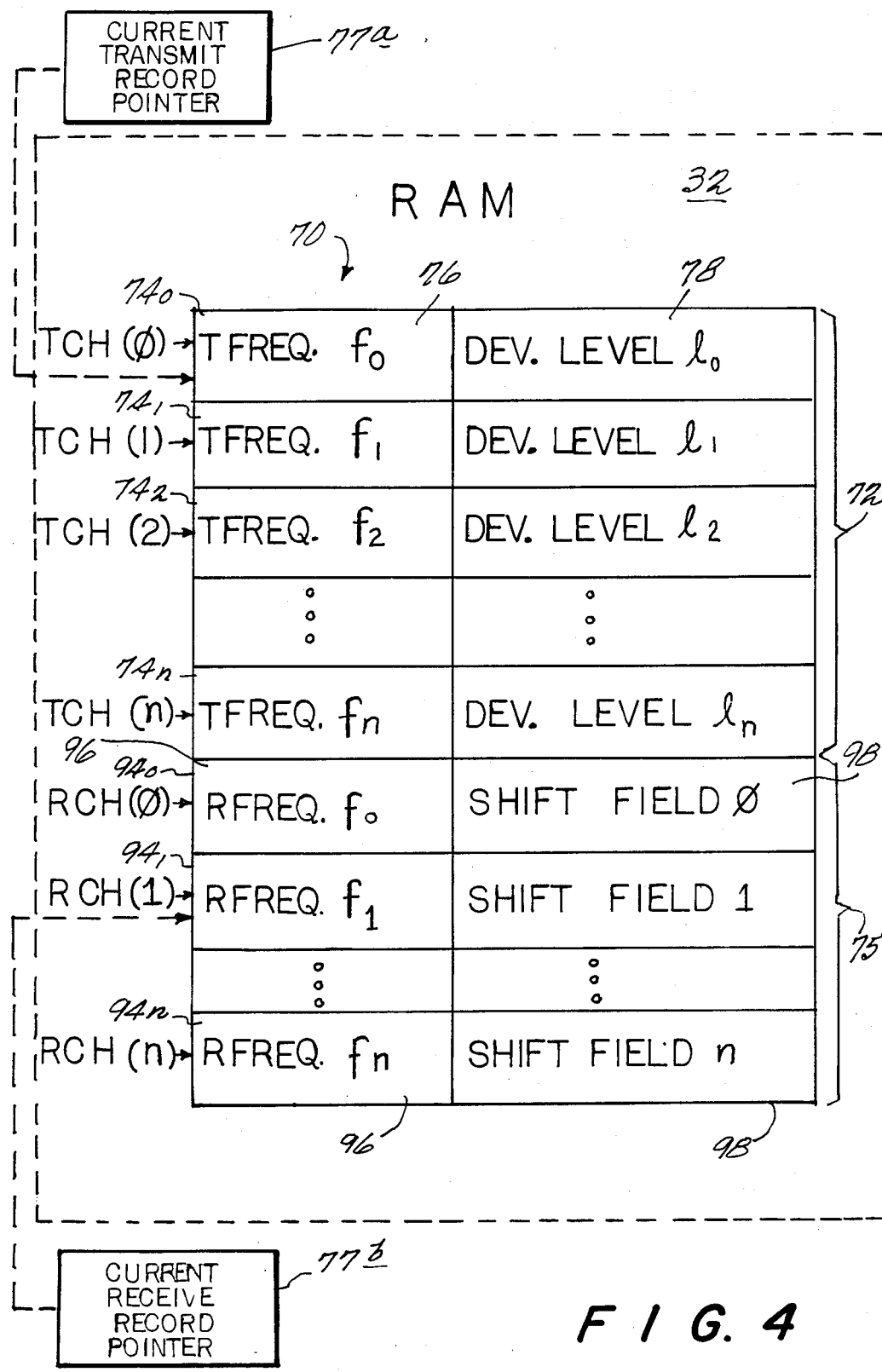
FIG. 4 is a schematic diagram of the data base stored in the memory shown in FIG. 2.

FIG. 4 schematically shows an exemplary data base 70 stored in memory 32 in the preferred embodiment shown in FIG. 2. Data base 70 includes a transmit data base 72 and a receive data base 75 (receive data base 75 will be described shortly). Transmit data base 72 includes a plurality of records $74_0$–$74_n$ corresponding to a desired frequency channel on which transceiver 10 is to transmit (for example, record $74_0$ corresponds to a transmit channel TCH(0), record $74_1$ corresponds to a transmit channel TCH(1), etc.).

Each of records $74_0$ through $74_n$ includes at least two fields: a frequency field 76 and a deviation level field 78. Frequency fields 76 contain digital words which, when applied to the DATA IN input of frequency synthesizer 16, cause the frequency synthesizer to produce a corresponding desired frequency at its output $f_{OUT}$. Deviation level fields 78 in the preferred embodiment contain a 5-bit digital word which, when applied to programmable attenuator 36 via signal lines 42, cause the programmable attenuator to amplify the audio signal applied thereto at a desired gain level.

The digital values stored in transmit data base 72 are obtained by first selecting the frequencies on which transceiver 10 is to operate, and then determining the digital values which must be applied to frequency synthesizer 16 to obtain those operating frequencies (this conversion process is dependent upon the design of synthesizer 16, and is well-known to those skilled in the art). Next, transceiver 10 is controlled to transmit, in sequence, on each of those desired frequencies, and the gain of programmable attenuator 36 necessary to obtain (but not exceed) 100% deviation of the FM RF signal applied to antenna 26 is determined.

For example, suppose frequency $f_0$ (i.e., TCH(0)) is equal to 464.000 MHz. The digital word which, when applied to the DATA IN input of frequency synthesizer 16, causes the frequency synthesizer to produce an output signal of 464.000 MHz (or the appropriate sub-harmonic of this frequency if frequency multiplication is used) is stored in the field 76 of record $74_0$.

To obtain the value to be stored in field 78 of record $74_0$, the value of field 76 is applied to the DATA IN input of frequency synthesizer 16, transceiver 10 is operated in the transmit mode, a signal of the maximum amplitude capable of being produced by microphone 46 is applied to the input of audio filtering and shaping circuit 34 (generally, microphone 46 should be disconnected for this operation and an audio signal generator connected instead), and different values are applied to signal lines 42 (to thereby change the gain of programmable attenuator 36) while the modulation level of the output of power amplifier 20 is analyzed (using a modulation monitor, a spectrum analyzer or in some other well-known manner).

The digital value which, when applied to programmable attenuator 36, causes the output of power amplifier 20 to have a modulation deviation level which is the closest to (but not exceeding) 100% modulation (i.e., which produces a deviation of 5 kHz for narrow band FM) is stored in field 78 of record $74_0$. This process is repeated for each of the transmit frequencies on which transceiver is to operate to obtain n records 74, each including a frequency data field 76 and an associated gain level field 78.

The above operation produces data which may be inputted to a minicomputer via a user interface device (e.g., a keyboard). The minicomputer is desirably programmed to format the data into an appropriate format, convert the data to a train of serial pulses, and transmit the serial data to microprocessor 28 via the SERIAL DATA IN line (all in a well-known manner). Microprocessor 28 converts the received data back to parallel format and stores the data into memory 32 in a manner to be described shortly.

Once data base 70 is stored in memory 32, microprocessor 28 selects one of records $74_0$-$74_n$ in accordance with signals applied to it via the CHANNEL UP and CHANNEL DN signal lines. Microprocessor 28 preferably maintains an address pointer 77a (e.g., an internal register) which contains the address, in memory 32, of the currently-selected one of records $74_0$-$74_n$. The contents of this pointer 77a are incremented whenever microprocessor receives a logic level 1 CHANNEL UP signal, and are decremented whenever the microprocessor receives a logic level 1 CHANNEL DN signal (address "roll-over" may be provided so that record $74_0$ is regarded by microprocessor 28 as having an address in memory 32 which is adjacent to the address of record $74_n$, as will be understood by those skilled in the art).

Whenever transceiver 10 is operated in the transmit mode, microprocessor 28 reads the contents of frequency data field 76 of the addressed one of records $74_0$-$74_n$ and applies the value read from this field to the input of frequency synthesizer 16 to control the transmit frequency of the transceiver—at the same time, the microprocessor reads the contents of the gain level field 78 of the addressed record 74 and applies the 5-bit value it reads from this field to the input of programmable attenuator 36 to control the gain of the programmable attenuator. Thus, programmable attenuator 36 is automatically programmed to amplify the output of filtering and shaping circuit 34 at a gain which is appropriate for the transmit frequency on which the transceiver is operating.

The cross-hatched band shown in FIG. 1 labelled "C" is a graphical representation of transmitter modulation deviation level obtainable in accordance with the programmable modulation compensation feature of the present invention. Because the gain of programmable attenuator 36 can be programmed for each transmitter operating frequency, the variation in deviation may be maintained to within 0.15 dB of 100% deviation using the 5-bit programmable attenuator 36 of the preferred embodiment (even less variation is possible if a programmable attenuator of higher precision is used). Thus, modulation deviation level is substantially constant over the entire transmitter operating range in accordance with the present invention. No manual adjustment of any variable circuit components within the radio transceiver is required to obtain constant modulation deviation level across the entire band.

Referring once again to FIG. 2, the operation of crystal oscillator 30 will now be described. Microprocessor 28 operates with a clock signal derived from crystal oscillator 30, as mentioned previously. Crystal oscillator 30 includes a crystal 80, capacitors 82 and 84, a resistor 86 and an amplifier circuit contained within the microprocessor itself (many conventional microprocessors contain such an internal amplifier circuit).

Crystal 80 and resistor 86 are connected in parallel across the Y1 and Y2 terminals of microprocessor 28, the Y1 and Y2 terminals of the microprocessor connecting to the microprocessor internal oscillator amplifier. One terminal of capacitor 82 is connected to terminal Y1, while the other terminal of this capacitor is connected to ground potential. Similarly, one terminal of capacitor 84 is connected to terminal Y2, while the other terminal of this capacitor is connected to ground.

Crystal oscillator 30 in the preferred embodiment also includes three additional components: a capacitor 88, an NPN transistor 90 and a resistor 92. One terminal of capacitor 88 is connected to terminal Y2 of microprocessor 28, and the other terminal of this capacitor is connected to the collector of transistor 90. The emitter of transistor 90 is connected to ground potential, while the base of the transistor is connected to an SEL output of microprocessor 28 through a series resistor 92.

Those skilled in the art will recognize that crystal 80, capacitors 82 and 84, and resistor 86 (together with the amplifier circuit internal to microprocessor 28) generate an oscillator signal the frequency of which is determined primarily by the characteristics of crystal 80.

However, when transistor 90 is conducting, the oscillator frequency is shifted slightly by the effect of the additional capacitance added to the oscillator circuit by capacitor 88.

When the SEL output of microprocessor 28 is at logic level 0, no base current flows through the base of transistor 90, and the transistor is in a non-conducting state. Because transistor 90 has a relatively high impedance when OFF, the transistor acts as an open circuit in its OFF state and capacitor 88 has little or no effect upon the overall capacitance of the circuit formed by capacitors 82 and 84, crystal 80 and resistor 86—in this state, oscillator 30 is operating at its "normal" frequency (i.e., at or near the resonant frequency of crystal 80).

When output SEL of microprocessor 28 rises to a logic level 1, base drive flows into transistor 90 to turn the transistor ON (thereby completing the connection between capacitor 88 and ground potential). When transistor 90 is ON, capacitor 88 is connected to the oscillator circuit to shift the resonant frequency of crystal 80 slightly, and thus changes the frequency of the clock signal generated by crystal oscillator 30. Hence when transistor 90 is conducting, crystal oscillator 30 operates in a SHIFTED state (i.e., the signal frequency it produces is shifted somewhat from the "normal" frequency of the oscillator).

Referring once again to FIG. 4, it will be recalled that data base 70 of the preferred embodiment includes a receive data base 75. Receive data base 75 includes n records $94_0$-$94_n$ corresponding to receive channels RCH (0)-RCH (n), respectively. Receive records $94_0$-$94_n$ each include a frequency data fields 96 and a shift bit field 98. Frequency data fields 96 (which are analogous to frequency data fields 76 of transmit record $94_0$-$94_n$) each contain a digital word which, when applied to the DATA IN input of frequency synthesizer 16, causes the frequency synthesizer to produce a signal at its $f_{OUT}$ terminal having a frequency which, when in turn applied to the $f_{IN}$ of receiver 24, causes the receiver to receive on a desired frequency.

The shift bit field 98 of each of records $94_0$-$94_n$ contains, in the preferred embodiment, a single bit which has a nominal value of logic level 0, but which may have a logic level 1 value if necessary to prevent a harmonic of the fundamental frequency clock signal produced by crystal oscillator 30 from interfering with signal reception, as will now be explained.

Suppose receiver 24 has a receive bandwidth of 12 kHz, crystal 80 has a frequency of 4.000 MHz, and it is desired that receiver 24 be tuned to a receive frequency of 646.00 MHz, transceiver 10 can itself produce no signal components within the range of 463.994 MHz and 464.006 MHz if interference with the desired receive channel is to be avoided. However, an on-channel spurious response might be caused by the 116th harmonic of the of crystal oscillator frequency (4.00 MHz×116=464.000 MHz).

To avoid interference, the frequency of oscillation of crystal oscillator 30 can be shifted a sufficient amount to move the 116th harmonic out of the desired clear spectrum. The 116th harmonic should be shifted in frequency at least 6 kHz, and, preferably 12 kHz (to provide a margin of error to allow for drifting of the crystal frequency due to temperature or voltage variations or due to aging). oscillator 30 by 0.0025% (25 parts per million) when it is connected in circuit (by the conductance of transistor 90), the 116th harmonic of the crystal oscillator is shifted an amount sufficient to eliminate on-channel spurious response. The value of capacitor 88 should be relatively small (i.e., approximately 20 picofarads) to cause this relatively slight shift in the frequency of oscillator 30 when transistor 90 is turned ON without causing runaway of crystal oscillator 30. It will be understood that the frequency of oscillation of crystal oscillator 30 is lowered, not raised, by the connection of capacitor 88 into the circuit because of the electrical characteristics of crystal 80.

Microprocessor 28 in the preferred embodiment includes an additional address pointer 77b which is used to address (i.e., point to) a selected one of records $94_0$-$94_n$ of receive data base 75. In a manner analogous to that described with respect to transmit data base 72 logic level 1 CHANNEL UP and CHANNEL DN signals cause microprocessor 28 to select a different one of records $94_0$-$94_n$ than the one previously selected by changing the value stored in register 77b.

When transceiver 10 is operated in the receive mode, microprocessor 28 reads the contents of the frequency data field 96 of the one of records $94_0$-$94_n$ addressed by its internal addressing register 77b, and loads this information into frequency synthesizer 16. The output of frequency synthesizer 16 in turn controls the frequency at which receiver 24 operates. At the same time, microprocessor 28 reads the contents of the shift bit field 98 of the addressed one of records $94_0$-$94_n$, and applies this read one-bit value to its SEL output for application to the base of transistor 90. If the shift bit field associated with a stored receive frequency contains a logic level 0, crystal oscillator 30 operates at its "normal" frequency. On the other hand the frequency of operation of crystal oscillator 30 is shifted a predetermined amount if the contents of the shift bit field 98 of the addressed one of records $94_0$-$94_n$ is a logic level 1.

One suitable way of obtaining the values of shift bit fields 98 is to first select the desired receive frequencies of transceiver 10, and then operate the transceiver at those desired frequencies, one at at time. The shift bit field 98 is set for any of records $94_0$-$94_n$ for which a spurious response attributable to a harmonic generated by crystal oscillator 30 is received. The values for shift bit fields 98 of different transceiver units can be made the same if the transceivers are programmed to have the same receive frequencies and also have crystals 80 with nearly the same characteristics.

The amount by which the frequency of crystal oscillator 30 must be shifted in order to eliminate spurious on-channel interference is determined by the RF channel bandwidth, the RF operating frequency, and the tolerance of the crystal 80 (or other oscillator frequency determining element). Sometimes, especially in transceivers operating in the lower frequency bands, it may be necessary to move the frequency of the 25 crystal oscillator 30 by several hundred parts per million or more—this frequency shift is greater than can be accomplished by switching components other than the crystal 80 itself.

FIG. 5 is a schematic diagram of a further exemplary circuit suitable for use as crystal oscillator 30 of the embodiment shown in FIG. 2. The oscillator shown in FIG. 5 includes two separate crystal oscillators 110a and 110b each of a construction similar to that shown in crystal oscillator 30 of FIG. 1 (although, in the oscillators shown in FIG. 5, the amplifier internal to microprocessor 28 is replaced by NAND gates 112a and 112b functioning as amplifiers in a well-known manner).

The SEL output of microprocessor 28 is connected to an input of NAND gate 112a and is also connected to the input of an inverter 114 (a NAND gate connected as an inverter in the preferred embodiment) the output of which is connected to an input of NAND gate 112b. The outputs of oscillators 110a and 110b are connected to respective inputs of a NAND gate 116. When the SEL output of microprocessor 28 is at logic level 1, NAND gate 112a becomes an inverting amplifier and oscillator 110a is thus activated (at the same time, NAND gate 112b is disabled). If the SEL output of microprocessor 28 is at logic level 0, a logic level 1 is applied to NAND gate 112b to cause it to act as an inverting amplifier, thereby enabling oscillator 110b (and disabling oscillator 110a). In this way, oscillators 110a and 110b are alternately enabled depending upon the level of the SEL output of microprocessor 28.

The resonant frequencies of crystals 80a and 80b are offset by a desired amount (e.g.. 300 or 400 parts per million) to provide a desired frequency shift in response to a change in the level of the SEL output of microprocessor 28. Thus, the arrangements described can be used to cause a crystal oscillator harmonic to be shifted off-channel even for transceivers operating with relatively large bandwidth at low operating frequencies.

There may be means known to those skilled in the art for selecting and disabling oscillator circuits and for controllably shifting the frequency of an oscillator circuit. For example, in some applications, the high stability provided by a crystal oscillator may not be necessary or desirable, and the microprocessor clock oscillator could in such cases take the form of a voltage-controlled oscillator (VCO) the control voltage of which is derived from a multi-bit shift field 98. Other alternate, equivalent arrangements are possible as is understood by those skilled in the art.

Figure 6:
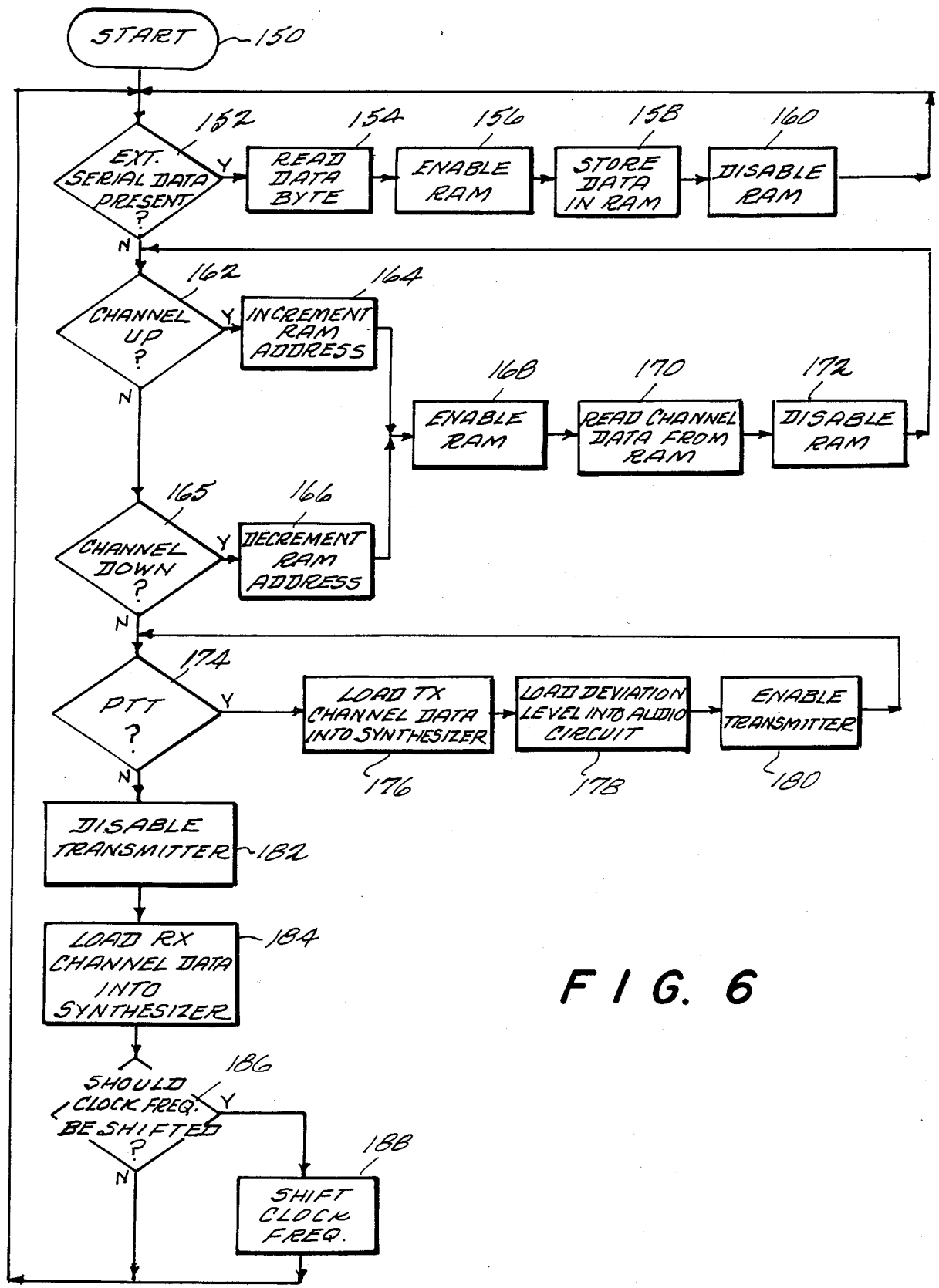
FIG. 6 is a flowchart of some of the relevant control function steps performed by the microprocessor shown in FIG. 2.

FIG. 6 is an exemplary flow chart showing a segment of the controlling programs including the novel steps performed by microprocessor 28 of the preferred embodiment under the control of software stored in memory 32 (or in a read only program stored internally to the microprocessor). In the flow chart shown in FIG. 6, control flow is from top to bottom beginning at the start block 150.

Upon startup, microprocessor 28 first determines whether any externally-applied serial data is present (block 152) by testing the contents of its internal UART buffer (not shown) operatively coupled to the SERIAL DATA IN line described previously. If serial data is present, a byte of data is read from the SERIAL DATA IN line (block 154) for storage into memory 32. Memory 32 is enabled (block 156) (by applying an appropriate control signal to it via signal line 40), the data received from the SERIAL DATA IN line is stored into the memory at a desired location (which may be specified either by the serial data itself or by the microprocessor programming) (block 158), and the memory is disabled (block 160). Control then returns once again to decision block 152 to determine if additional data is to be read from the SERIAL DATA IN line and stored into memory 32. Blocks 152-160 are used to program data base 70 at time of production or in the field, as described previously.

If no serial data is present on the SERIAL DATA IN line (decision block 152). microprocessor 28 determines if a logic level 1 CHANNEL UP signal is present (decision block 162). If the CHANNEL UP signal is active, microprocessor 28 increments the contents of the address registers (77a, 77b) pointing to records in transmit data base 72 and/or receive data base 75 (block 164) (in some applications, where it is desirable to select receive and transmit frequencies independently, an additional control signal applied to microprocessor 28 may be used to indicate whether the channel to be incremented is the transmit channel or the receive channel—in other applications, such as where repeaters having fixed pairs of input and output frequencies are to be communicated with, pointers into transmit data base 72 and receive data base 75 are incremented and decremented simultaneously to preserve desired pairing of receive and transmit frequencies).

If microprocessor 28 determines that the CHANNEL UP signal is not at logic level 1, but determines that the CHANNEL DN signal is active (i.e., is at logic level 1) (decision block 165), microprocessor 28 decrements the contents of the address registers 77a, 77b pointing into transmit data base 72 and/or receive data base 75 (block 166). In either case, microprocessor 28 enables RAM 32 (by applying an appropriate control signals to it via control lines 40 (block 168), reads data from the one of records $74_0$-$74_n$ and the one of records $94_0$-$94_n$ pointed to by the receive and transmit address registers (block 170), and subsequently disables memory 32 (block 172). After memory 32 is disabled, control is returned to decision block 162 to determine whether additional channel changes are desired.

If both the CHANNEL UP and the CHANNEL DN signals are inactive (decision blocks 162, 165), microprocessor 28 determines whether the PTT IN signal is active (decision block 174)—if it is, transceiver 10 is to operate in the transmit mode. To transmit, microprocessor 28 loads the contents of frequency data field 76 read from the one of transmit records $74_0$-$74_n$ pointed to by the transmit address register 77a (and read by block 170), and loads this frequency data into frequency synthesizer 16 (block 176). Microprocessor 28 then loads the value read by block 170 from the deviation gain level field 78 corresponding to the selected frequency data field 76, and applies this gain level data to programmable attenuator 36 via signal lines 42 (block 178). Finally, microprocessor 28 enables modulator 18 and power amplifier 20 (and disables receiver 24) by causing the TX/RX signal line to rise to logic level 1 (block 180).

Control then returns to decision block 174 to determine if the PTT IN signal is still at logic level 1—if it is, blocks 176-180 are performed again and transceiver 10 continues to transmit. If, on the other hand, the signal PTT IN has fallen to logic level 0, microprocessor 28 disables transmission by causing the TX/RX signal to fall to logic level 0 (thereby disabling modulator 18 and power amplifier 20 and enabling receiver 24) (block 182). The contents of the frequency data field 96 of the one of records $94_0$-$94_n$ read by block 170 are then loaded into frequency synthesizer 16 to cause the receiver 24 to operate on the desired receive frequency (block 184). As will be understood, blocks 176-180 (and blocks 182-188) need only be performed once (when the PTT IN signal first changes state).

If the shift bit field 98 of the selected one of records $94_0$-$94_n$ read by block 170 is set (decision block 186), the microprocessor 28 applies a logic level 1 to its SEL output to shift the frequency of crystal oscillator 30 (block 188). Otherwise, microprocessor 28 applies a logic level 0 to the SEL output to cause the crystal oscillator 30 to operate at its "normal38 frequency.

Control then returns to decision block 152 to test once again for the various inputs as described.

While the present invention has been described with what is presently considered to be the most practical and preferred embodiments, it is to be understood that the appended claims are not to be limited to the disclosed embodiments but on the contrary, are intended to cover all modifications, variations and/or equivalent arrangements which retain any of the novel features and advantages of this invention. By way of non-limiting example, although the preferred embodiment of the present invention is a radio transceiver, the invention could be used with a transmitter, a receiver, or other radio communications device.

What is claimed:

1. In a radio frequency receiving device of the type including: (1) a tunable radio receiver for receiving radio frequency signals at selected radio frequencies, (2) clock oscillator means for producing a clock synchronizing signal, and (3) a memory, a digital controller synchronized by said clock synchronizing signal communicating with said memory, connected to control said radio receiver and said clock oscillator means, and programmed so as to effect the following functions:
   (a) select one of a plurality of radio frequency values stored in said memory;
   (b) tune said receiver to receive signals using said selected radio frequency value; and
   (c) adjust the frequency of the clock synchronizing signal produced by said clock oscillator means using information associated with said selected radio frequency information stored in said memory to prevent spurious signals generated by said clock oscillator means from interfering with radio frequencies to which said receiver is tuned.

2. A method of controlling a radio receiver of the type including a microprocessor, said method comprising the steps of:
   (1) storing information representing a plurality of preset radio frequencies;
   (2) storing, for each of said preset radio frequencies, associated corresponding predetermined control information specifying one of at least a first and a second state;
   (3) selecting stored information representing one of said preset radio frequencies;
   (4) tuning said radio receiver to receive signals at said selected radio frequency using the stored information representing said selected radio frequency;
   (5) synchronizing said microprocessor to operate at a first clock frequency if the stored predetermined control information corresponding to said selected radio frequency specifies said first state; and
   (6) synchronizing said microprocessor to operate at a second clock frequency different from said first clock frequency if said stored predetermined control information corresponding to said selected radio frequency specifies said second state.

3. A method as in claim 2 wherein: said synchronizing step (5) includes the step of continuously producing a clock synchronizing signal at a nominal fixed frequency and applying same to said microprocessor; and
said synchronizing step (6) includes the steps of shifting the frequency of said clock synchronizing signal from said nominal fixed frequency to a shifted frequency offset from said nominal frequency when said predetermined stored control information corresponding to said selected radio frequency specifies said second state, and applying said shifted frequency clock signal to said microprocessor.

4. A method as in claim 2 wherein:
said synchronizing step (5) includes the step of operating a crystal oscillator circuit operatively coupled to said microprocessor at a nominal fixed clock frequency determined by the characteristics of a crystal frequency-determining element; and
said synchronizing step (6) includes the step of switching a reactive element into circuit with said crystal frequency-determined element when said stored predetermined control information corresponding to said selected radio frequency specifies said second state to thereby shift the frequency of operation of said oscillator circuit away from said nominal fixed frequency.

5. In a microprocessor-controlled radio receiver of the type including tunable radio receiver means for receiving radio frequency signals at selected controllable radio frequencies a memory, a microprocessor operatively coupled to said memory, and clock oscillator means operatively coupled to said microprocessor for continuously producing a clock synchronizing signal at a nominal fixed clock frequency and applying same to said microprocessor to synchronize the operation of said microprocessor, a method comprising the steps of:
   (1) storing information representing a plurality of preset radio frequencies in said memory;
   (2) storing in said memory, for each of said preset radio frequencies, predetermined associated corresponding control information specifying one of a normal state and a shifted state;
   (3) selecting stored information representing one of said preset radio frequencies;
   (4) tuning said radio receiver means to receive signals at said selected radio frequency using the stored information representing said selected radio frequency; and
   (5) shifting the frequency of the clock synchronizing signal produced by said clock oscillator means away from said nominal fixed clock frequency if the stored predetermined control information corresponding to said selected radio frequency specifies said shifted state.

6. A method as in claim 5 wherein said shifting step (5) includes the step of shifting the frequency of said clock synchronizing signal from said nominal frequency to a shifted frequency offset from said nominal fixed frequency when said stored predetermined control information corresponding to said selected radio frequency specifies said shifted state, to thereby shift harmonics of said clock synchronizing signal out of the passband of said radio receiver means.

7. A method as in claim 5 wherein:
said method further includes the step of continuously operating said clock oscillator means at a nominal fixed frequency determined by the characteristics of a crystal frequency-determining element; and
said shifting step (5) includes the step of switching a reactance into circuit with said crystal frequency-determining element when said stored predetermined control information corresponding to said selected radio frequency specifies said shift state to thereby shift the frequency of operation of said clock oscillator means away from said nominal fixed frequency.

8. A method as in claim 5 wherein said shifting step (5) includes the steps of:
 (a) disabling said clock oscillator means from operating and
 (b) enabling a further clock oscillator means also coupled to said microprocessor to operate, said further clock oscillator means producing a clock synchronizing signal at a fixed frequency different from said nominal fixed frequency.

9. An apparatus for controlling a radio receiver of the type including a digital controller, said apparatus comprising:
 means for storing information representing a plurality of preset radio frequencies and for also storing, for each of said preset radio frequencies, associated corresponding predetermined control information representing one of a first and a second state;
 means for selecting stored information representing one of said preset plurality of radio frequencies;
 means for receiving radio frequency signals;
 means coupled to said receiving means for tuning said receiving means to receive radio signals at said selected reset radio frequency using said selected stored information; and
 means coupled to said digital controller for synchronizing said digital controller to operate at a first clock frequency if the stored predetermined control information corresponding to said selected stored radio frequency information specifies said first state, and for synchronizing said digital controller to operate at a second clock frequency different from said first clock frequency if said stored predetermined control information corresponding to said selected stored radio frequency information specifies said second state.

10. An apparatus as in claim 9 wherein said synchronizing means includes:
 oscillator means for continuously producing a clock synchronizing signal at a nominal fixed frequency and for applying said synchronizing signal to said digital controller; and
 means operatively connected to said oscillator means for shifting the frequency of said clock synchronizing signal from said nominal fixed frequency to a different frequency when said stored predetermined control information corresponding to said selected stored radio frequency information represents said second state.

11. An apparatus as in claim 9 wherein said synchronizing means includes:
 crystal oscillator circuit means, operatively coupled to said digital controller, said oscillator circuit means including a crystal frequency-determining element said oscillator circuit means for continuously operating at a nominal fixed clock frequency determined by the characteristics of said crystal frequency-determining element; and
 switching means, coupled to said oscillator means, for switching a reactance into circuit with said crystal frequency-determining element when said stored predetermined control information corresponding to said selected radio frequency information represents said second state to thereby shift the frequency of operation of said oscillator circuit means away from said nominal fixed frequency.

12. In a digitally-controlled radio receiver of the type including a tunable radio receiver receiving radio signals at a programmable radio frequency, a digital controller connected to control said radio receiver, and clock oscillator means operatively coupled to said digital controller for continuously producing a clock synchronizing signal and applying same to said digital controller to synchronize the operation of said digital controller, an improvement comprising:
 memory means for storing predetermined information representing a plurality of preset radio frequencies and for storing, for each of said preset radio frequencies associated corresponding preset control information specifying one of a normal state and a shifted state;
 means for selecting stored information representing one of said preset radio frequencies;
 means for tuning said radio receiver to receive radio signals using said selected stored information; and
 means operatively connected to said oscillator means for shifting the frequency of the clock synchronizing signal produced by said clock oscillator means if the stored predetermined control information corresponding to said selected radio frequency information specifies said shifted state.

13. An apparatus as in claim 12 wherein said shifting means includes means for shifting the frequency of said clock synchronizing signal from said nominal fixed clock frequency to a different clock frequency when said stored predetermined control information corresponding to said selected radio frequency information specifies said shifted state, to thereby shift harmonics of said synchronizing signal out of the passband of said receiver.

14. An apparatus as in claim 12 wherein:
 said clock oscillator means includes a crystal frequency-determining element for determining the frequency of the clock synchronizing signal produced thereby; and
 said shifting means includes means for switching a reactance into circuit with said crystal frequency-determining element when said stored predetermined control information corresponding to said selected radio frequency information specifies said shifted state to thereby shift the frequency of operation of said clock oscillator means away from said nominal fixed frequency.

15. An apparatus, as in claim 12 wherein:
 said clock oscillator means is operated at a nominal fixed frequency; and
 said shifting means includes:
  further clock oscillator means, coupled to said digital controller' for producing a further clock synchronizing signal of a fixed frequency different from said nominal fixed frequency,
  means for disabling said first-mentioned clock oscillator means from operating when said stored preset control information corresponding to said selected radio frequency information specifies said shifted state, and
  means for enabling said further clock oscillator means to operate when said stored preset control information corresponding to said selected radio frequency information specifies said shifted state.

* * * * *